US009368496B1

(12) United States Patent
Yu et al.

(10) Patent No.: US 9,368,496 B1
(45) Date of Patent: Jun. 14, 2016

(54) METHOD FOR UNIFORM RECESS DEPTH AND FILL IN SINGLE DIFFUSION BREAK FOR FIN-TYPE PROCESS AND RESULTING DEVICES

(71) Applicant: GLOBALFOUNDRIES Inc., Grand Cayman, KY (US)

(72) Inventors: Hong Yu, Rexford, NY (US); HongLiang Shen, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/609,614

(22) Filed: Jan. 30, 2015

(51) Int. Cl.
*H01L 21/336* (2006.01)
*H01L 21/76* (2006.01)
*H01L 27/088* (2006.01)
*H01L 21/70* (2006.01)
*H01L 29/06* (2006.01)
*H01L 29/66* (2006.01)
*H01L 29/08* (2006.01)
*H01L 29/16* (2006.01)
*H01L 29/78* (2006.01)

(52) U.S. Cl.
CPC ........ *H01L 27/0886* (2013.01); *H01L 29/0649* (2013.01); *H01L 29/0847* (2013.01); *H01L 29/16* (2013.01); *H01L 29/6656* (2013.01); *H01L 29/66636* (2013.01); *H01L 29/66795* (2013.01); *H01L 29/785* (2013.01); *H01L 29/7855* (2013.01)

(58) Field of Classification Search
CPC ............... H01L 27/0886; H01L 29/66795; H01L 29/6656; H01L 29/785; H01L 29/7855; H01L 29/66636; H01L 21/76224
USPC .......... 257/288, 368, 401, 506, 510, E21.546; 438/294, 306, 424, 300
See application file for complete search history.

(56) References Cited

U.S. PATENT DOCUMENTS

| 8,878,309 B1* | 11/2014 | Hong et al. | 257/401 |
| 9,105,746 B2* | 8/2015 | Kim et al. | |
| 2003/0222319 A1* | 12/2003 | Azuma | 257/408 |
| 2015/0294969 A1* | 10/2015 | Lee et al. | 257/401 |

\* cited by examiner

*Primary Examiner* — Aaron Gray
(74) *Attorney, Agent, or Firm* — Ditthavong & Steiner, P.C.

(57) ABSTRACT

Methods for creating uniform source/drain cavities filled with uniform levels of materials in an IC device and resulting devices are disclosed. Embodiments include forming a hard mask on an upper surface of a Si substrate, the hard mask having an opening over a STI region formed in the Si substrate and extending over adjacent portions of the Si substrate; forming low-k dielectric spacers on a lower portion of sidewalls of the opening, the spacers being formed between the sidewalls and the STI region; filling the opening with an oxide; removing the hard mask; removing an upper portion of the oxide and a portion of the low-k dielectric spacers; revealing a Si fin in the Si substrate; forming equally spaced gate electrodes, each having sidewall spacers, over the Si fin and the oxide; and forming source/drain regions in the Si fin between each pair of adjacent gate electrodes.

14 Claims, 15 Drawing Sheets

FIG. 1A
BACKGROUND

FIG. 1B
BACKGROUND

METHOD FOR UNIFORM RECESS DEPTH AND FILL IN SINGLE DIFFUSION BREAK FOR FIN-TYPE PROCESS AND RESULTING DEVICES

TECHNICAL FIELD

The present disclosure relates generally to designing and fabricating integrated circuit (IC) devices. The present disclosure is applicable to design and fabrication processes associated with single diffusion break (SDB) structures in fin-type field-effect-transistor (FINFET) IC devices.

BACKGROUND

Generally, in fabrication of an IC device, a photolithography process may be utilized to print/pattern cavities/regions on a surface of a silicon (Si) substrate for creating various devices (e.g., transistors) and circuits to form the IC device. Different cavities may be formed at different stages of the fabrication process. In some instances, the cavities may have different shapes or sizes and may be created in different regions of a substrate. For example, a cavity intended to form a source region for a field-effect transistor (FET) may have a certain size, may be at a certain location in the substrate, or may be filled with a certain material. In another example, channels in a metal layer may be filled with copper (e.g., to interconnect different devices in the IC) or a shallow trench isolation (STI) region may be filled with an oxide. Some cavities may be formed at the same time with the intention that they would substantially have the same size, shape, and extend to the same depth in a substrate. However, some of the cavities may be formed on an area of the substrate that has already gone through a prior process that has affected the surface geometry of that area on the substrate. In such a case, cavities formed on the affected surface may be different than cavities formed on an adjacent surface area.

Figure 1A:
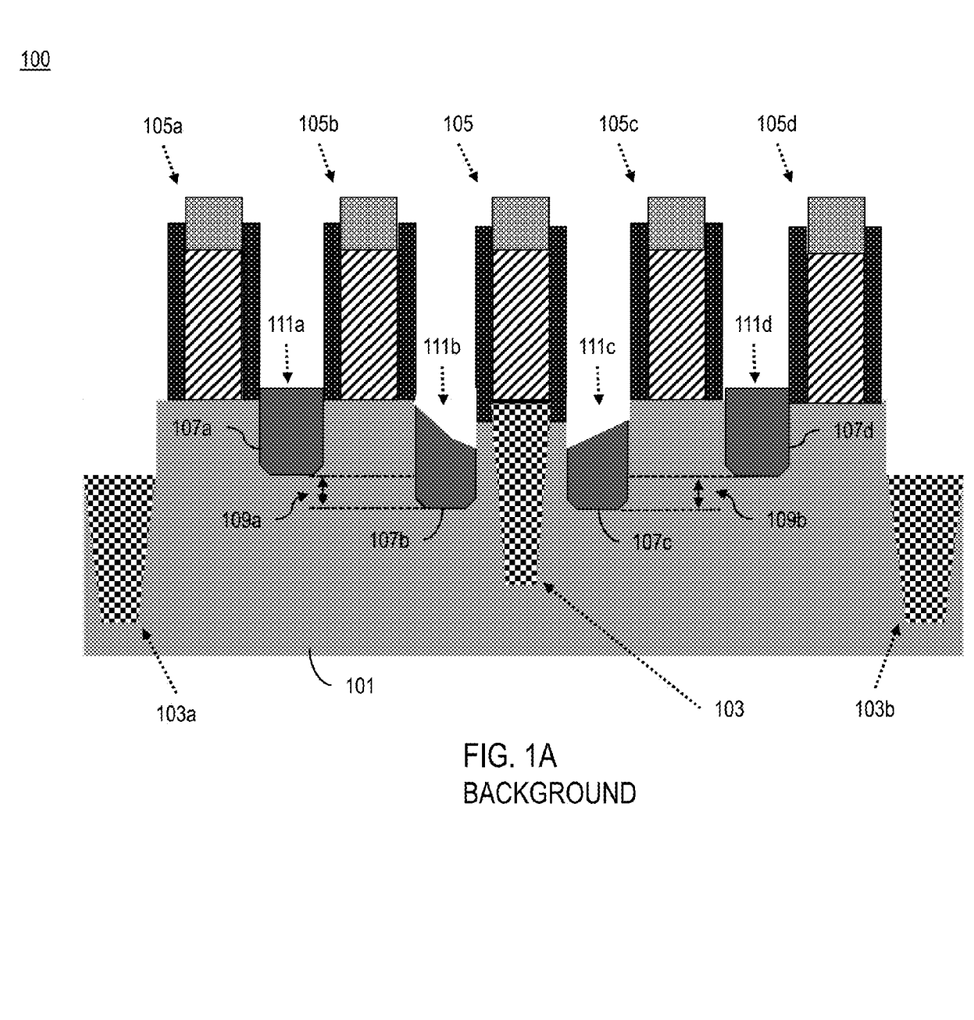
FIGS. 1A and 1B are cross sectional diagrams of an example IC device.
Figure 1B:
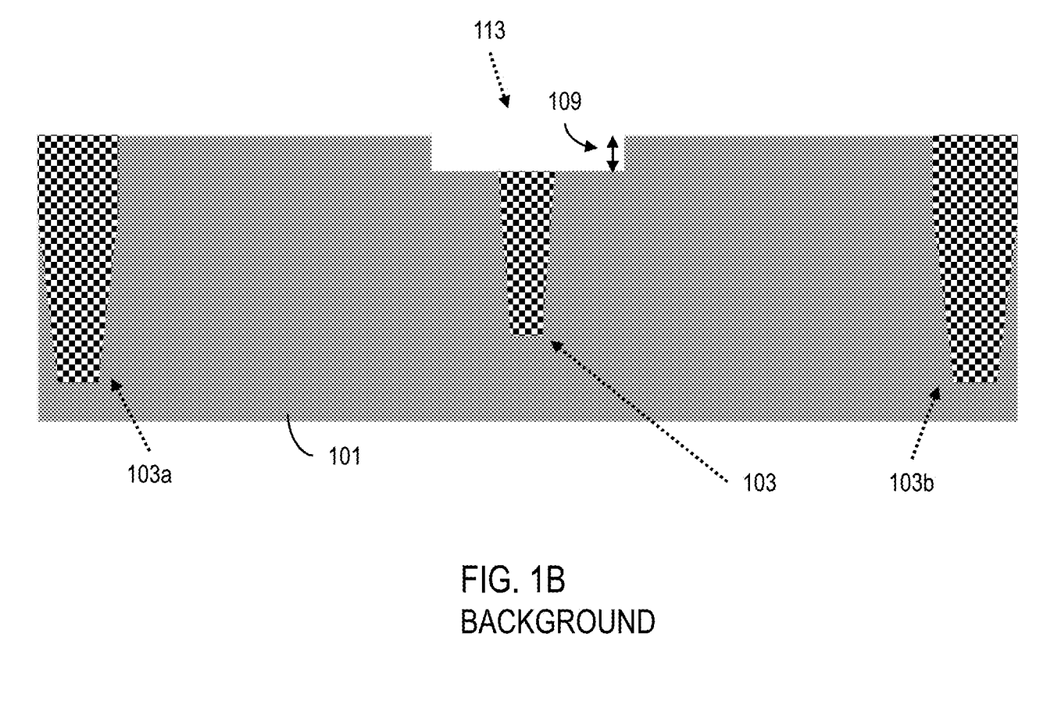

FIGS. 1A and 1B are cross sectional diagrams of an example IC device. FIG. 1A illustrates an example FINFET IC device 100 that includes substrate 101; a plurality of STI regions 103, 103a, and 103b; a plurality of gate electrodes 105, 105a, 105b, 105c, and 105d placed over corresponding fins formed in the substrate; source/drain cavities 107a, 107b, 107c, and 107d. In this example, the gate electrode 105 is a dummy gate placed over the STI 103 that separates neighboring transistors. As shown, the cavities 107b and 107c adjacent to the sides of the STI 103 extend deeper into the substrate 101 when compared to their respective adjacent cavities 107a and 107d, wherein the depth differences are indicated by markers 109a and 109b. During the IC fabrication, source/drain materials may be epitaxially (epi) grown in the cavities 107a to 107d to respective levels 111a to 111d; however, due to the depth difference in the cavities 107b and 107c, the material levels and surfaces 111b and 111c are irregular and not to the same level (underfilled) as their neighboring cavities 111a and 111d, respectively. The irregular levels and surfaces of the materials in the cavities 107b and 107c can present issues when connecting source/drain contacts to the surfaces 111b and 111c.

FIG. 1B depicts a step in the current fabrication process in which the silicon around STI region 103 is recessed or gouged to prevent side oxide loss at the SDB during a subsequent fin reveal. The recess 113 lowers the starting surface for forming cavities 107b and 107c, thereby creating the depth differences 109a and 109b.

A need therefore exists for a methodology enabling creation of uniform source/drain cavities in a substrate of an IC device and the resulting device.

SUMMARY

An aspect of the present disclosure is an IC device that includes uniform source/drain cavities filled with uniform levels of materials.

Another aspect of the present disclosure is a method for creating uniform source/drain cavities filled with uniform levels of materials in an IC device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a hard mask on an upper surface of a Si substrate, the hard mask having an opening over a STI region formed in the Si substrate and extending over adjacent portions of the Si substrate; forming low-k dielectric spacers on a lower portion of sidewalls of the opening, the spacers being formed between the sidewalls and the STI region; filling the opening with an oxide; removing the hard mask; removing an upper portion of the oxide and a portion of the low-k dielectric spacers; revealing a Si fin in the Si substrate; forming equally spaced gate electrodes, each having sidewall spacers, over the Si fin and the oxide; and forming source/drain regions in the Si fin between each pair of adjacent gate electrodes.

In one aspect, forming of the low-k dielectric spacers includes conformally forming a low-k dielectric layer on an upper surface of the hard mask and in the opening; and removing the low-k dielectric layer from the upper surface of the hard mask, an upper surface of the STI region, and a portion of each sidewall.

Another aspect includes the filling of the opening with an oxide by forming an oxide layer over the upper surface of the hard mask; and removing the oxide layer from the upper surface of the hard mask.

Further aspects include forming additional STI regions in the Si substrate at opposite sides of and separated from the STI region by revealing the Si fin by removing an upper portion of each of the additional STI regions.

In another aspect, the forming of the source/drain regions includes forming a cavity in the Si fin between each pair of the adjacent gate electrodes; and epitaxially growing source/drain materials in the cavity.

In a further aspect, upper surfaces of the materials in the source/drain regions at opposite sides of a gate electrode over the oxide are coplanar with upper surfaces of the materials in other source/drain regions.

In some aspects, depths of the source/drain regions at the opposite sides of the gate electrode over the oxide are same as depths of the other source/drain regions.

Another aspect of the present disclosure includes a device including: a Si fin in a Si substrate; a STI region in the Si fin in the Si substrate; low-k dielectric spacers on the Si fin in the Si substrate at opposite sides of the STI region; an oxide over the Si fin in the Si substrate, between the low-k dielectric spacers; equally spaced gate electrodes, each having sidewall spacers, including one gate electrode over the oxide; and source/drain regions in the Si fin between each pair of adjacent gate electrodes.

In some aspects, the device includes additional STI regions in the Si substrate at opposite sides of and separated from the STI region, wherein an upper portion of each of the additional STI regions is removed to reveal the Si fin.

In further aspects of the device, the upper portion of each of the additional STI regions extends deeper than the source/drain regions.

In one aspect of the device, each of the source/drain regions includes a cavity in the Si fin between a pair of the adjacent gate electrodes; and source/drain materials epitaxially grown in the cavity.

In another aspect of the device, upper surfaces of the materials in the source/drain regions at opposite sides of the one gate electrode are coplanar with upper surfaces of the materials in other source/drain regions.

In a further aspect of the device, depths of the source/drain regions at the opposite sides of the one gate electrode are same as depths of the other source/drain regions.

Another aspect of the present disclosure includes a method including: forming a hard mask on an upper surface of a Si substrate, the hard mask having an opening over a STI region formed in the Si substrate and extending over adjacent portions of the Si substrate; forming an oxide layer on sidewalls of the opening; forming low-k dielectric spacers on a lower portion of the oxide layer, the spacers being formed between the oxide layer and the STI region; filling the opening with an oxide; removing the hard mask; removing an upper portion of the oxide and the oxide layer; revealing a Si fin in the Si substrate; forming equally spaced gate electrodes, each having sidewall spacers, over the Si fin and the oxide; and forming source/drain regions in the Si fin between each pair of adjacent gate electrodes.

In one aspect, forming of the low-k dielectric spacers includes: conformally forming a low-k dielectric layer on an upper surface of the hard mask and in the opening; and removing the low-k dielectric layer from the upper surface of the hard mask, an upper surface of the STI region and a portion of the oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of underfilled and irregular cavities in an IC device attendant upon forming source/drain cavities at opposite sides of an SDB. The present disclosure addresses and solves such problems, for instance, by, inter alia, forming low-k dielectric spacers to protect the SDB oxide during fin reveal rather than Si gouging.

FIGS. 2A through 2L schematically illustrate a process flow for creating uniform cavities filled with uniform levels of materials in an IC device, in accordance with an exemplary embodiment.

Figure 2A:
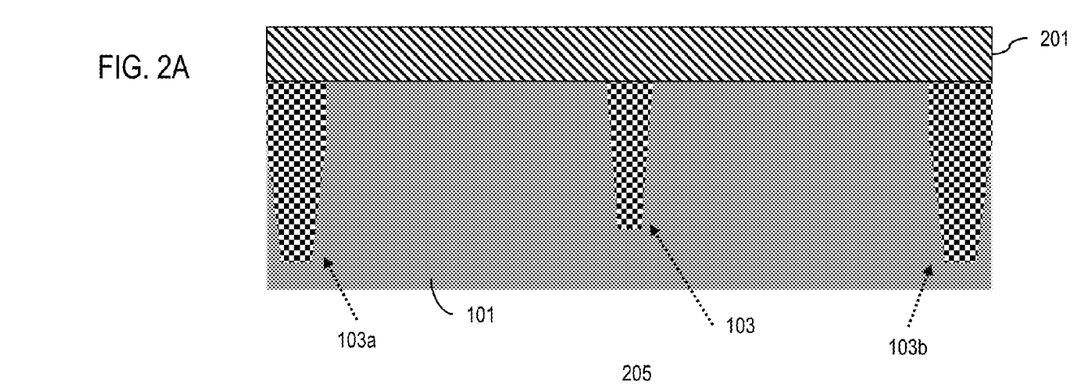
FIGS. 2A through 2L schematically illustrate a process flow for creating uniform cavities filled with uniform levels of materials in an IC device, in accordance with an exemplary embodiment.
Figure 2B:
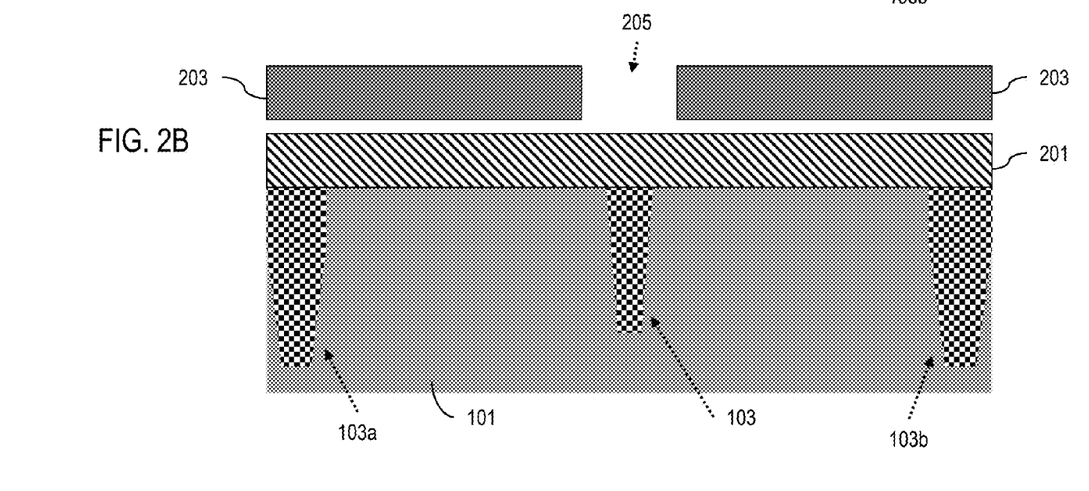
Figure 2C:
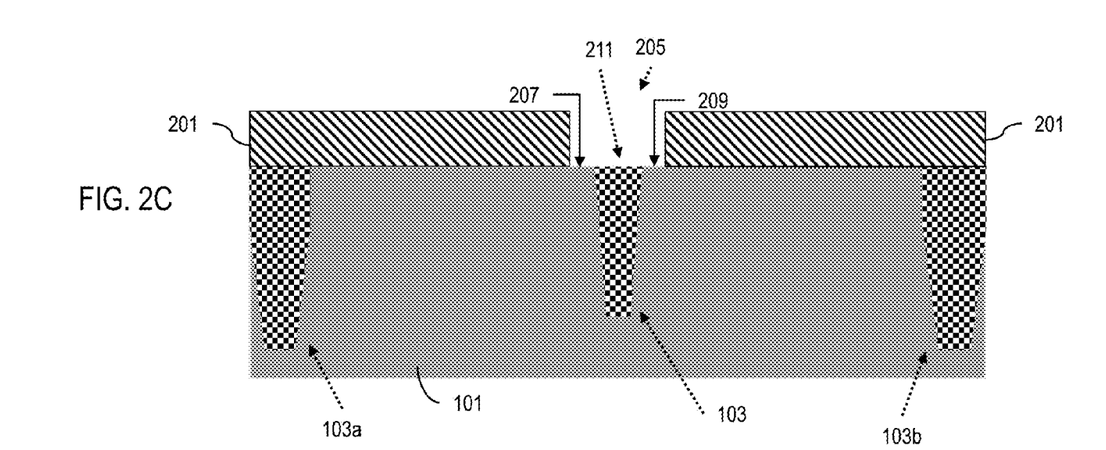
Figure 2D:
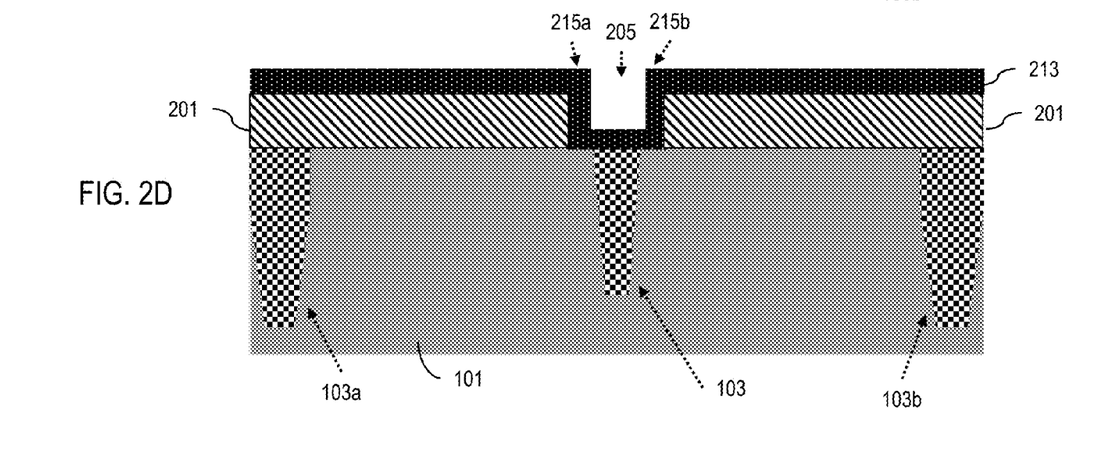
Figure 2E:
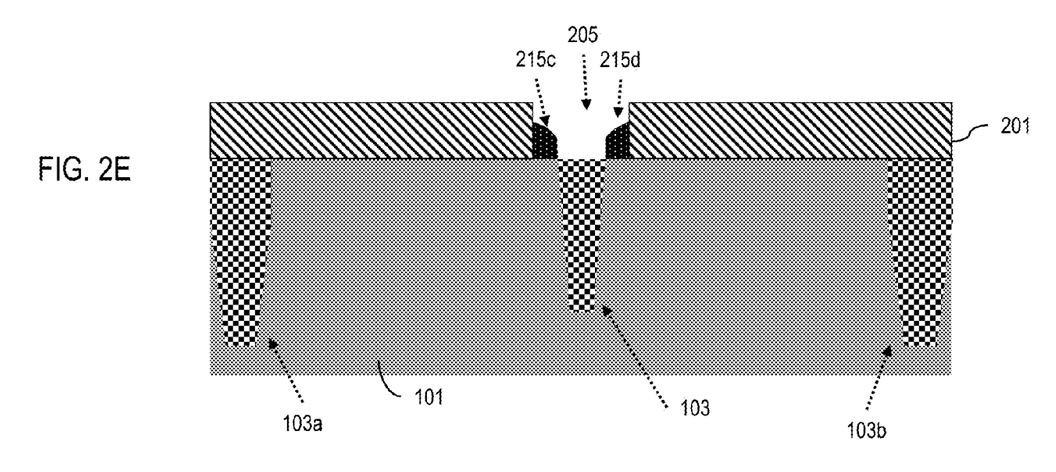

FIG. 2A illustrates the Si substrate 101 including the STI regions 103, 103a, and 103b. Additionally, a hard mask 201 (e.g., silicon nitride (SiN) or amorphous carbon (a-C)) is formed over the upper surface of the substrate 101. In FIG. 2B, a photolithography mask 203 is utilized to pattern an opening 205 into the hard mask 201, wherein the opening 205 in the hard mask 201, as shown in FIG. 2C, may be created by using a reactive-ion etching (RIE) process. Further, FIG. 2C illustrates the opening 205 exposing regions 207 and 209 on the upper surface of the substrate 101 and upper surface region 211 of the STI 103. It is noted that the upper surfaces of the substrate 101 and the STI 103 are not affected by the etching process when creating the opening 205. As shown in FIG. 2D, a low-k dielectric layer 213 (e.g., silicon oxycarbonitride (SiOCN) or silicon borocarbonitride (SiBCN)) is formed (e.g., via chemical vapor deposition (CVD)) on an upper surface of the hard mask 201 as well as on side and bottom surfaces of the opening 205, wherein the dielectric layer 213 covers the upper surface region 211 of the STI 103, and creates sidewalls 215a and 215b on the upper surface regions 207 and 209 of the substrate 101. In FIG. 2E, the dielectric layer 213 is removed (e.g., etched) from the upper layer of the hard mask 201 and the upper surface region 211 of the STI 103. Further, an upper portion of each of the sidewalls 215a and 215b is removed to create spacers 215c and 215d in the opening 205.

Figure 2F:
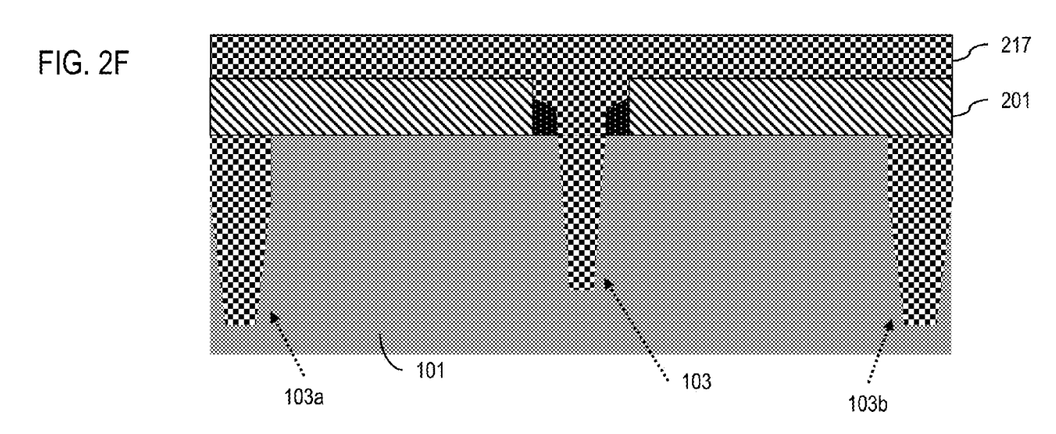
Figure 2G:
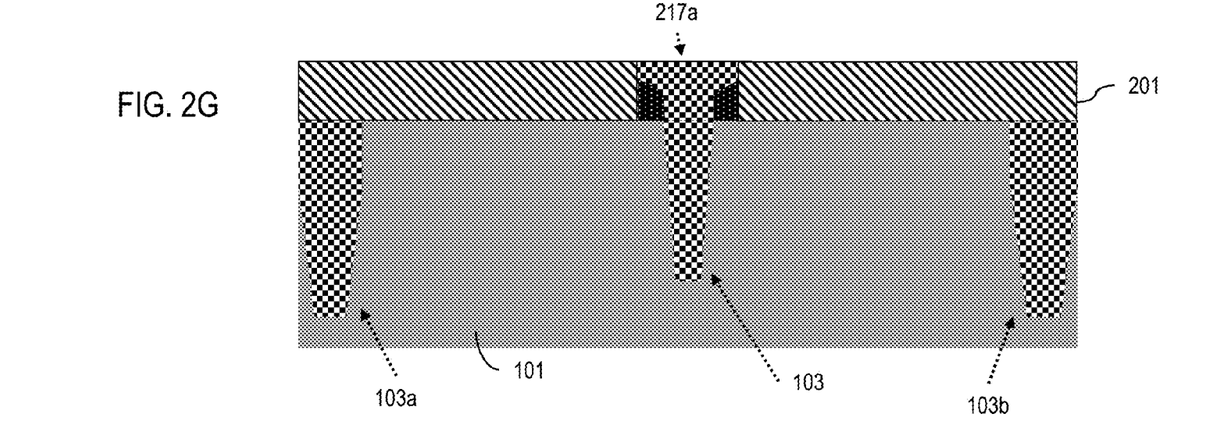
Figure 2H:
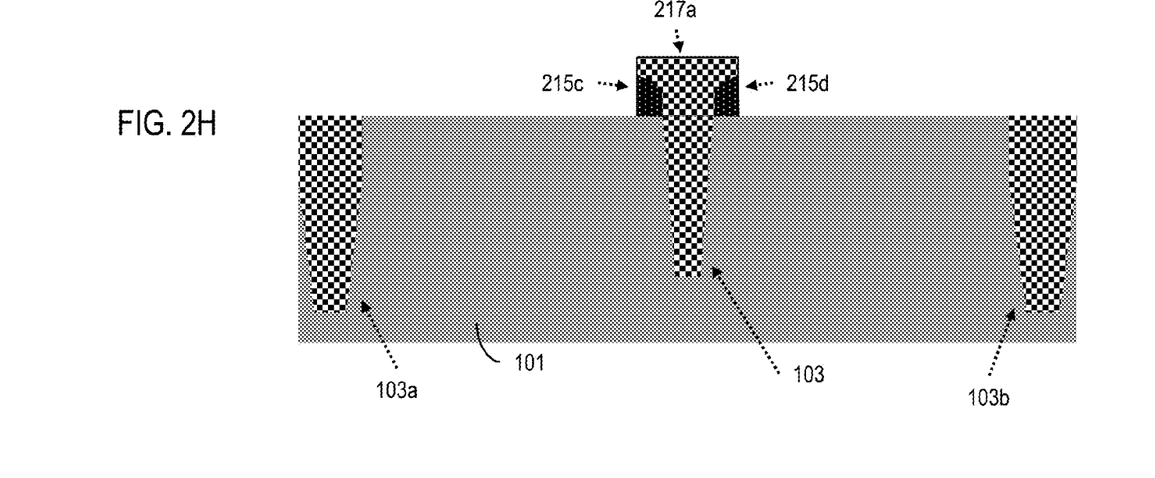
Figure 2I:
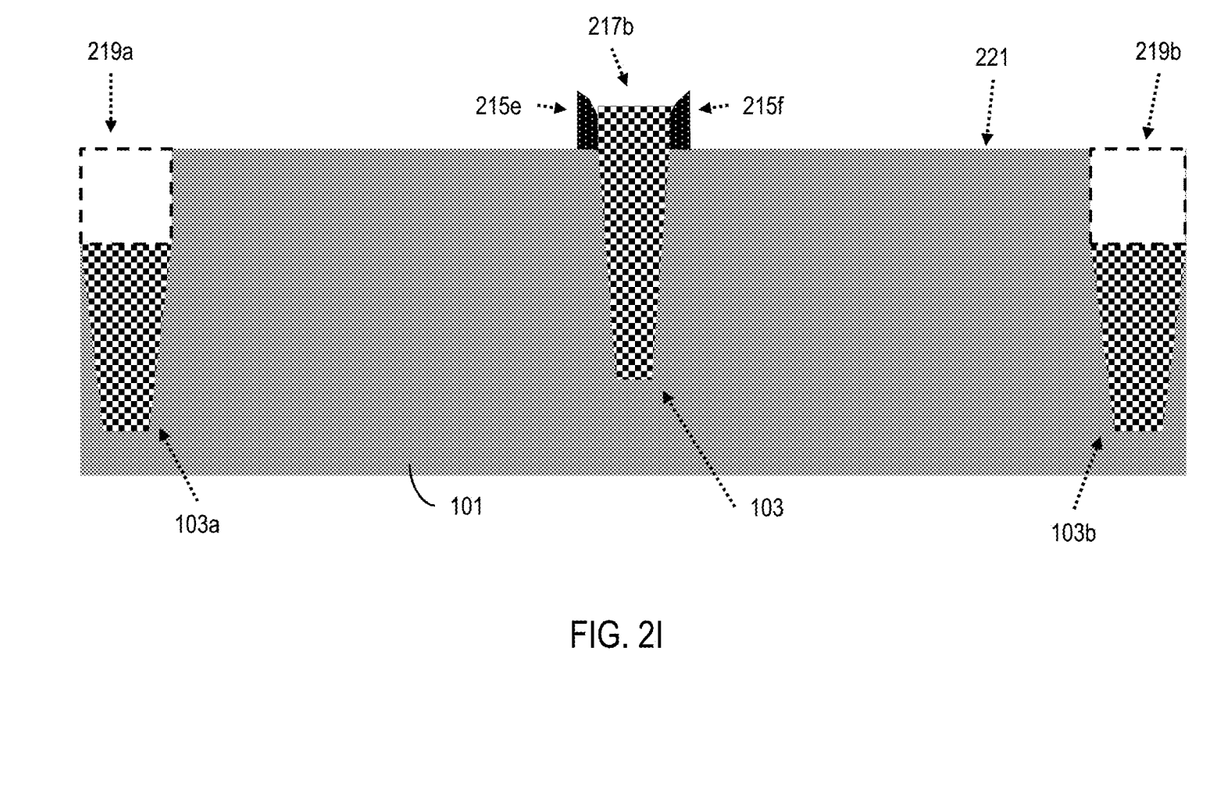
Figure 2J:
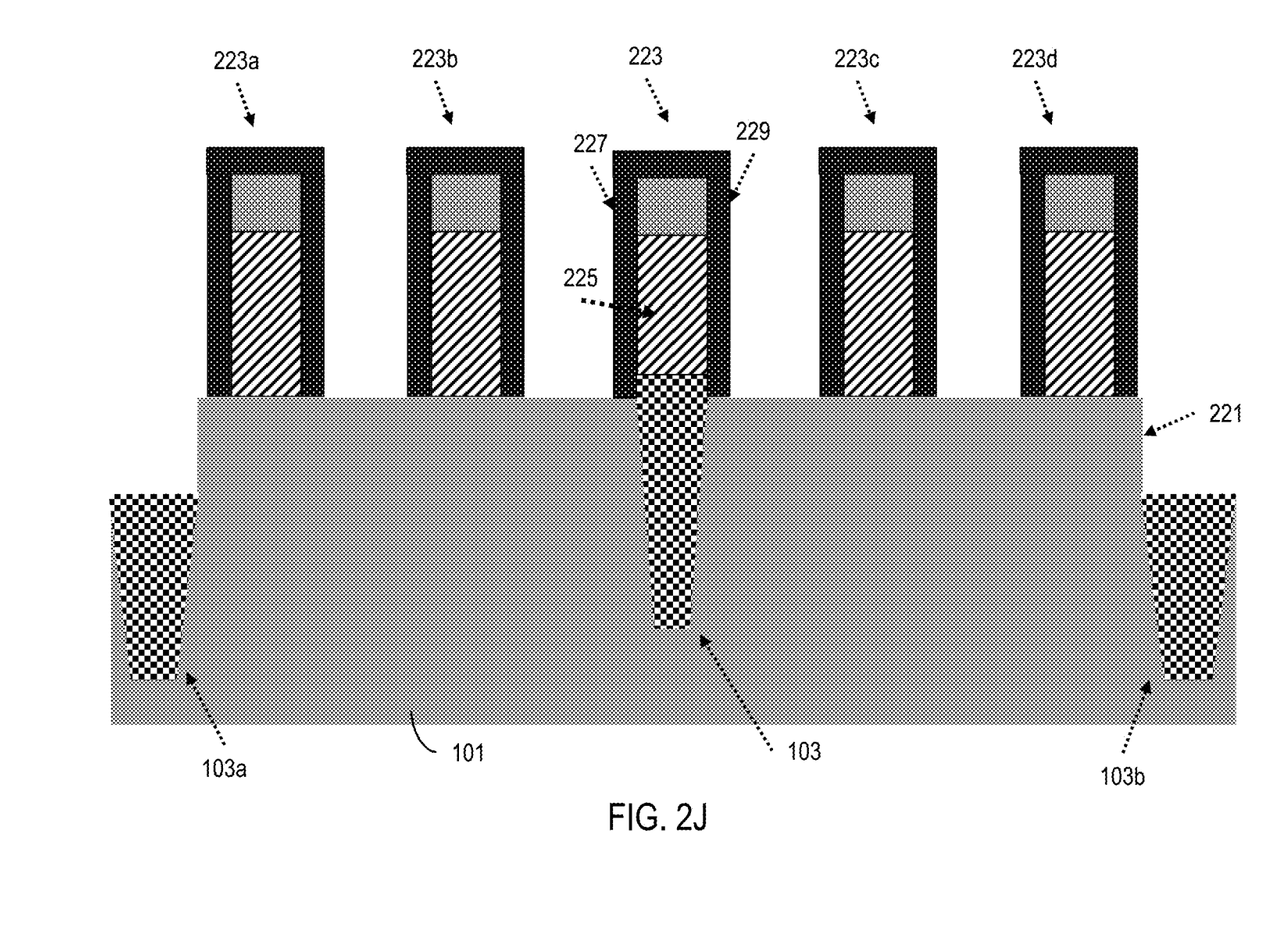
Figure 2K:
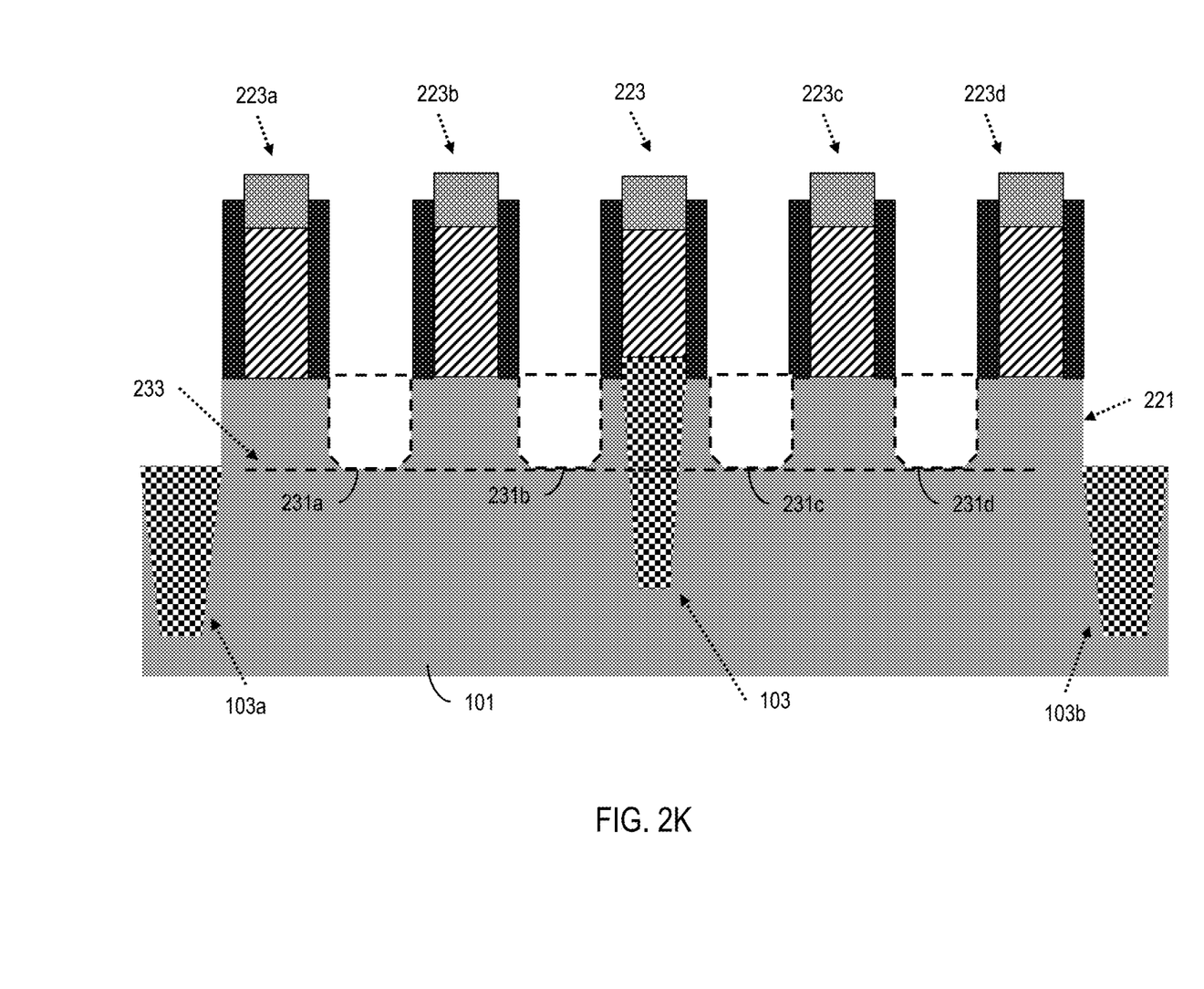
Figure 2L:
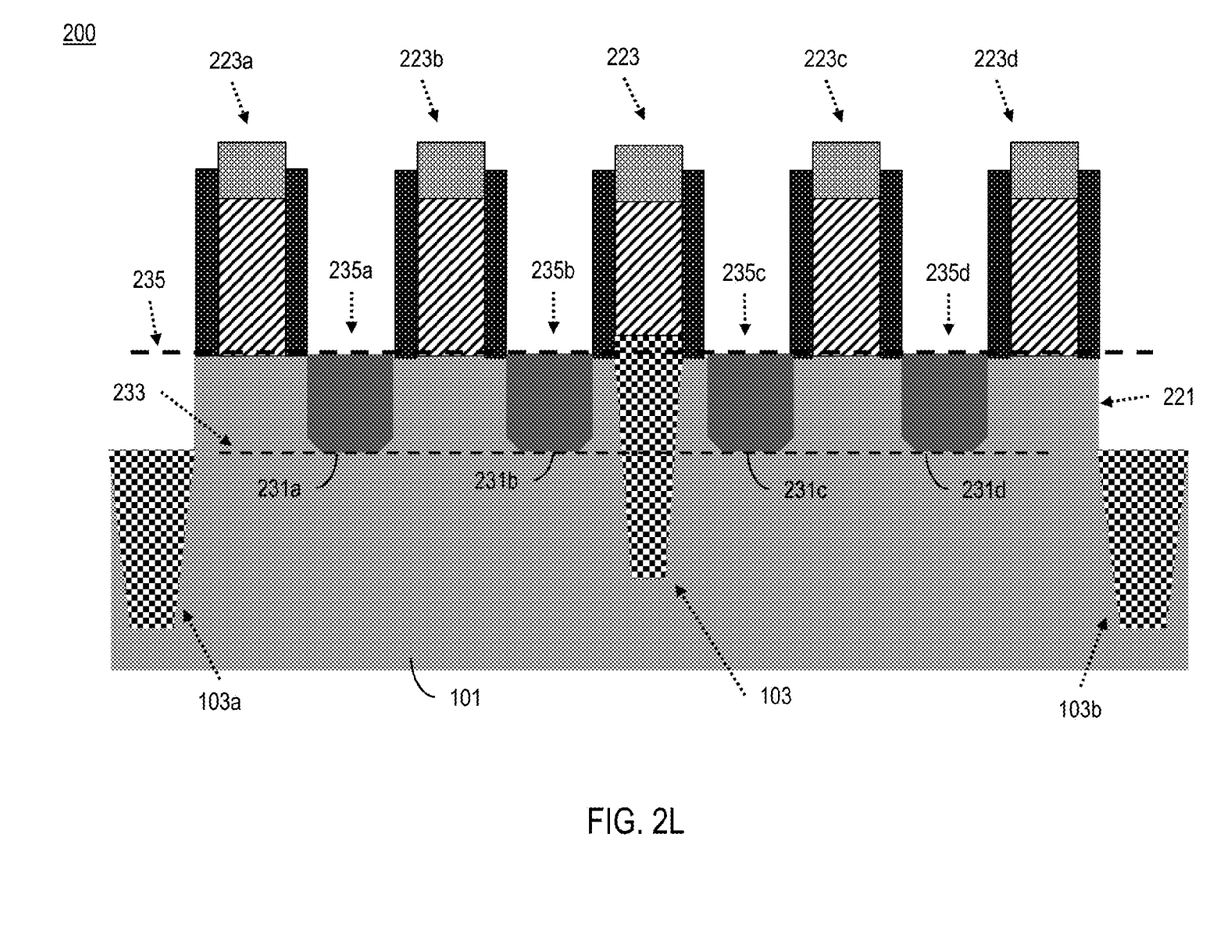

Referring now to FIG. 2F, an oxide layer 217 is deposited (e.g., via high-density plasma (HDP) CVD) on the upper surface of the hard mask 201, wherein the oxide layer 217 deposition also fills the opening 205. In FIG. 2G, chemical mechanical polishing (CMP) is performed down to an upper surface of hard mask 201. Next, as shown in FIG. 2H, the hard mask 201 is removed, or stripped, to expose the spacers 215c and 215d and oxide material 217a that was formed in the opening 205 and in between the spacers 215c and 215d. As shown in FIG. 2I, during removal of portions 219a and 219b of STI regions 103a and 103b, respectively, to reveal the Si fin 221, a portion of each of the oxide material 217a and the spacers 215c and 215d is also removed, leaving oxide material 217b on the upper surface region 211 of the STI 103 and in between spacers 215e and 215f. As shown in FIG. 2J, dummy gate electrodes 223, 223a, 223b, 223c, and 223d are placed at equidistance over the upper surface of the substrate fin 221. The dummy gate electrode 223 is formed over oxide material 217b and its two side spacers 227 and 229, respectively, are formed on the spacers 215e and 215f of FIG. 2I. Next, as shown in FIG. 2K, source/drain cavities 231a, 231b, 231c, and 231d are formed extending into the Si fin 221 and are between each pair of adjacent gate electrodes (e.g., 223a-223b, 223b-223, etc.), where the cavities 231a to 231d substantially extend to a same depth 233 in the Si fin 221. As shown in FIG. 2L, in device 200, the cavities 231a to 231d are filled with (e.g., epi grown) source/drain material to a substantially uniform level 235 forming proper upper surfaces 235a, 235b, 235c, and 235d that are suitable for connection to respective contacts in the IC device 200.

FIGS. 3A through 3I schematically illustrate a process flow for creating uniform cavities filled with uniform levels of materials in an IC device, in accordance with another exemplary embodiment. Although some of the steps in FIGS. 3A through 3I are similar to those in FIGS. 2A through 2L, the process steps in FIGS. 3A through 3I will be discussed further.

Figure 3A:
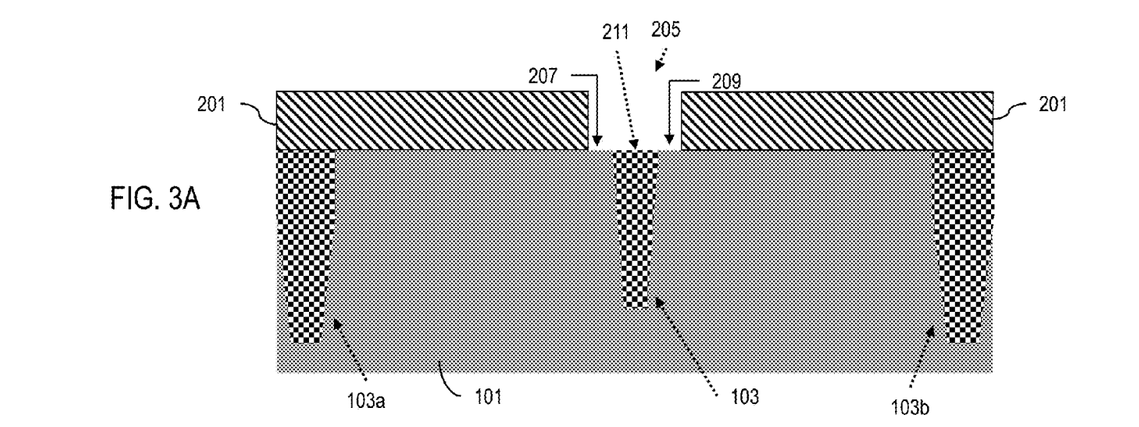
FIGS. 3A through 3I schematically illustrate a process flow for creating uniform cavities filled with uniform levels of materials in an IC device, in accordance with another exemplary embodiment.
Figure 3B:
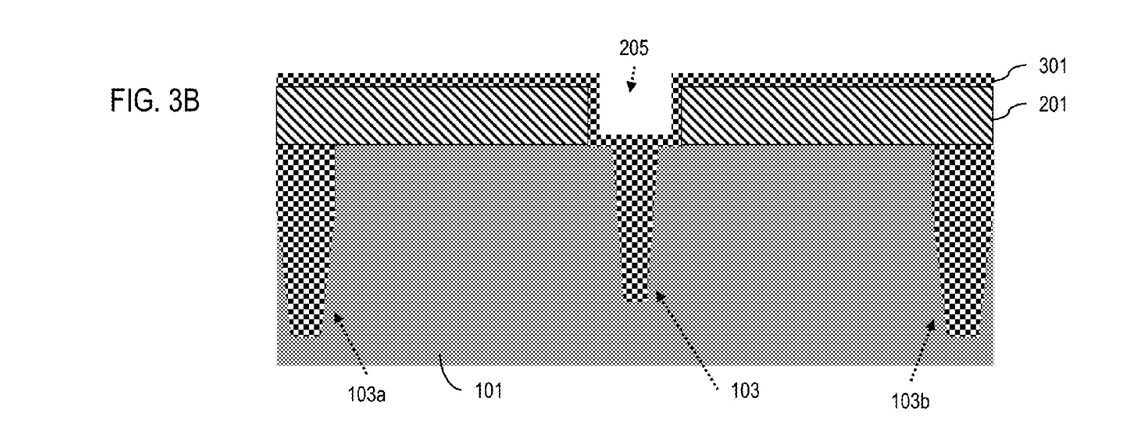
Figure 3C:
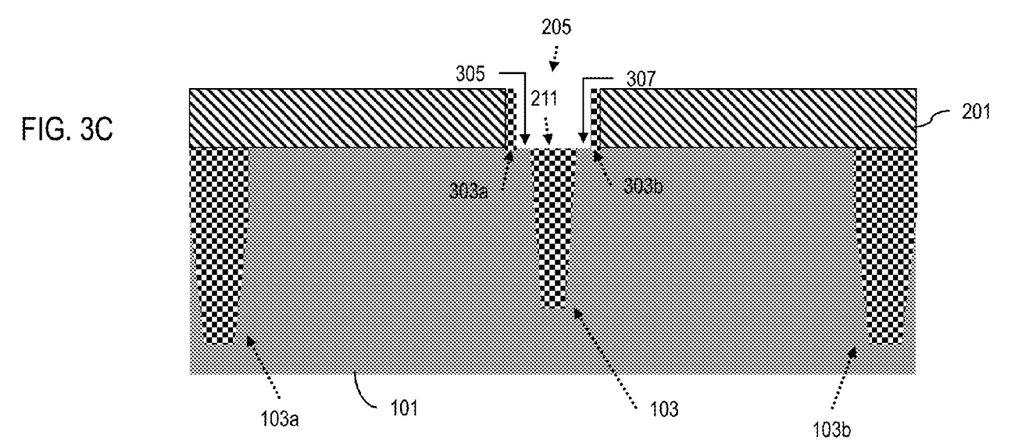
Figure 3D:
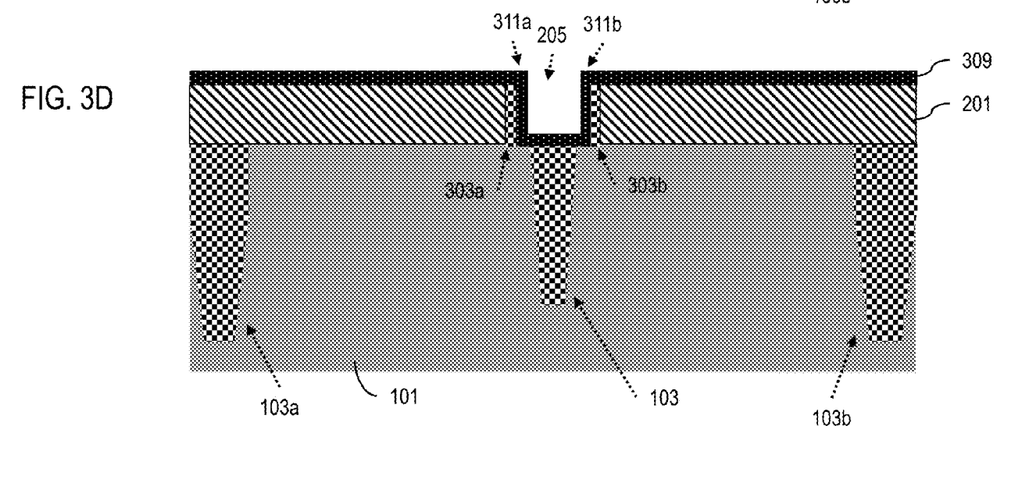
Figure 3E:
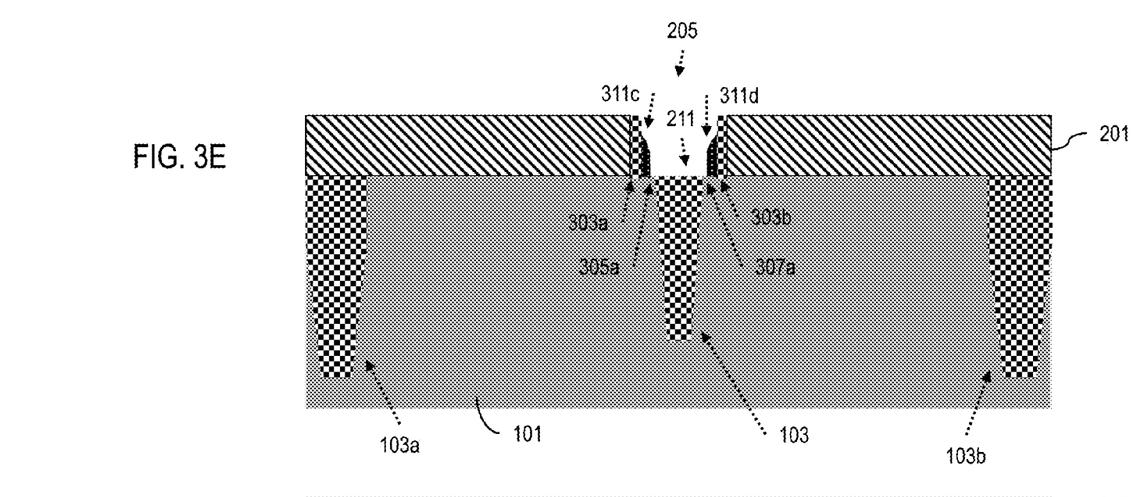

FIG. 3A illustrates the substrate 101, and includes STI and hard mask structures, which are similar to those of FIG. 2C, where previous process steps discussed in FIGS. 2A through 2C may have been utilized to fabricate the STI and hard mask structures in the substrate 101. Next, as shown in FIG. 3B, an oxide layer 301 is deposited (e.g., by atomic layer deposition (ALD)) on the upper surface of the hard mask 201 and onside and bottom surfaces of opening 205, covering the upper surface regions 207, 209, and 211. In FIG. 3C, the oxide layer 301 is removed from all horizontal surfaces, e.g. by etching back the upper surface of the hard mask 201, the upper surface region 211 of the STI 103, and upper surface regions 305 and 307 of the substrate 101. As a result, oxide sidewalls 303a and 303b are formed on portions of the upper surface regions 305 and 307 in the opening 205. As shown in FIG. 3D, a low-k dielectric layer 309 (e.g., SiOCN or SiBCN) is formed on an upper surface of the hard mask 201 as well as on side and bottom surfaces of the opening 205, wherein the dielectric layer 309 covers the upper surface region 211 of the STI 103, creates spacers 311a and 311b on portions of the upper surface regions 305 and 307 of the substrate 101, i.e., adjacent to the oxide sidewalls 303a and 303b, respectively. As shown in FIG. 3E, the dielectric layer 309 is removed from horizontal surfaces, e.g. the upper surface of the hard mask 201, the upper surface region 211 of the STI 103, and upper surface regions 305a and 307a of the substrate 101 (adjacent sides of the upper surface region 211 of the STI 103) by etching. Further, an upper portion of each of the spacers 311a and 311b is removed to create spacers 311c and 311d in the opening 205.

Figure 3F:
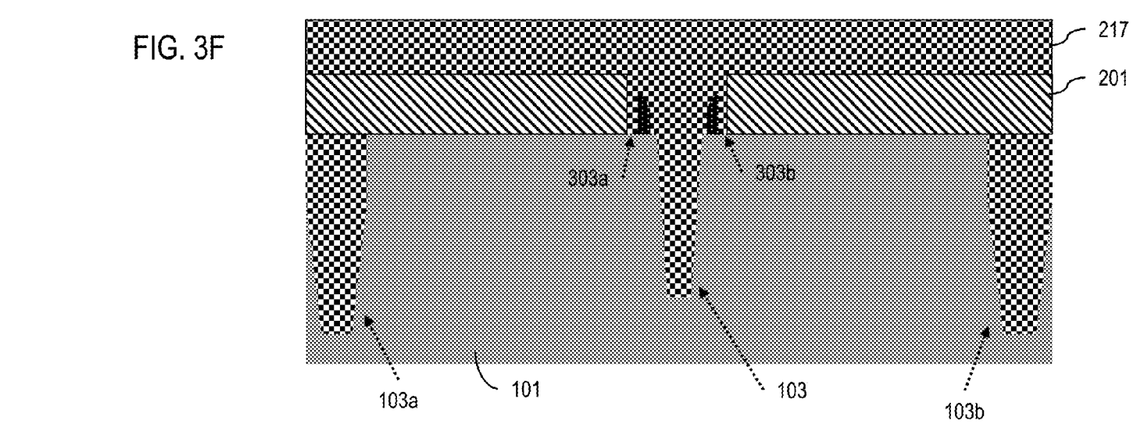
Figure 3G:
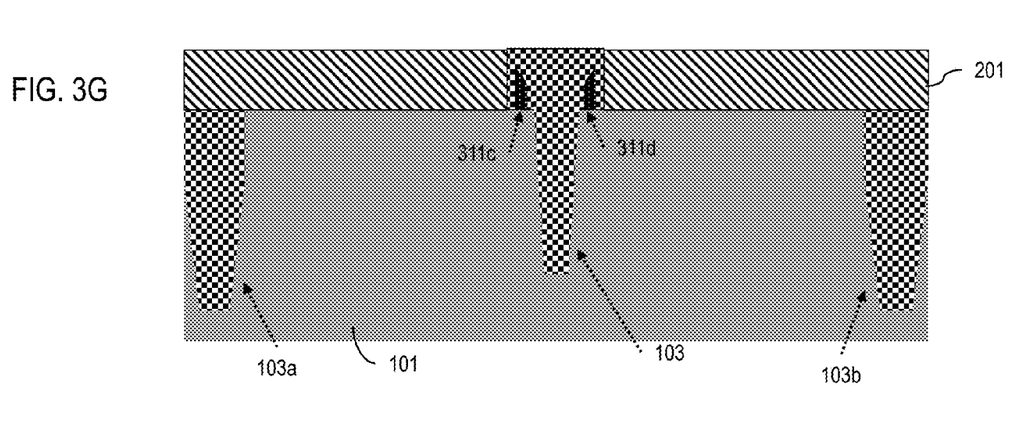
Figure 3H:
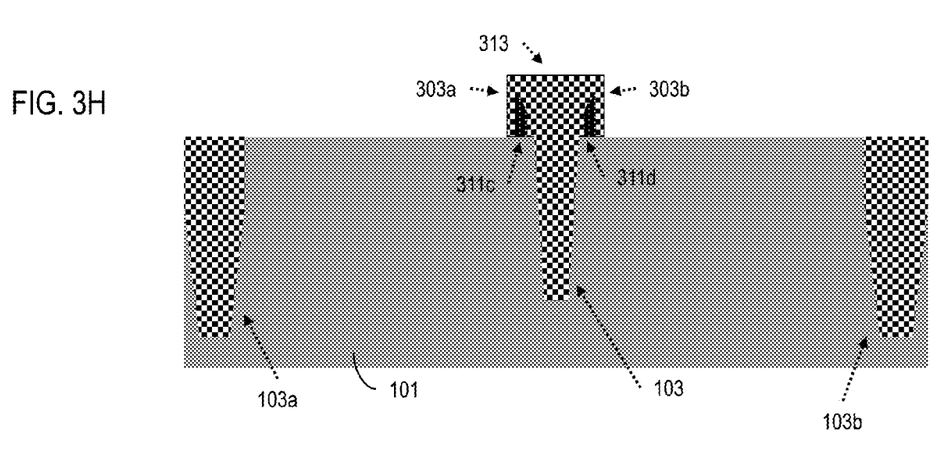
Figure 3I:
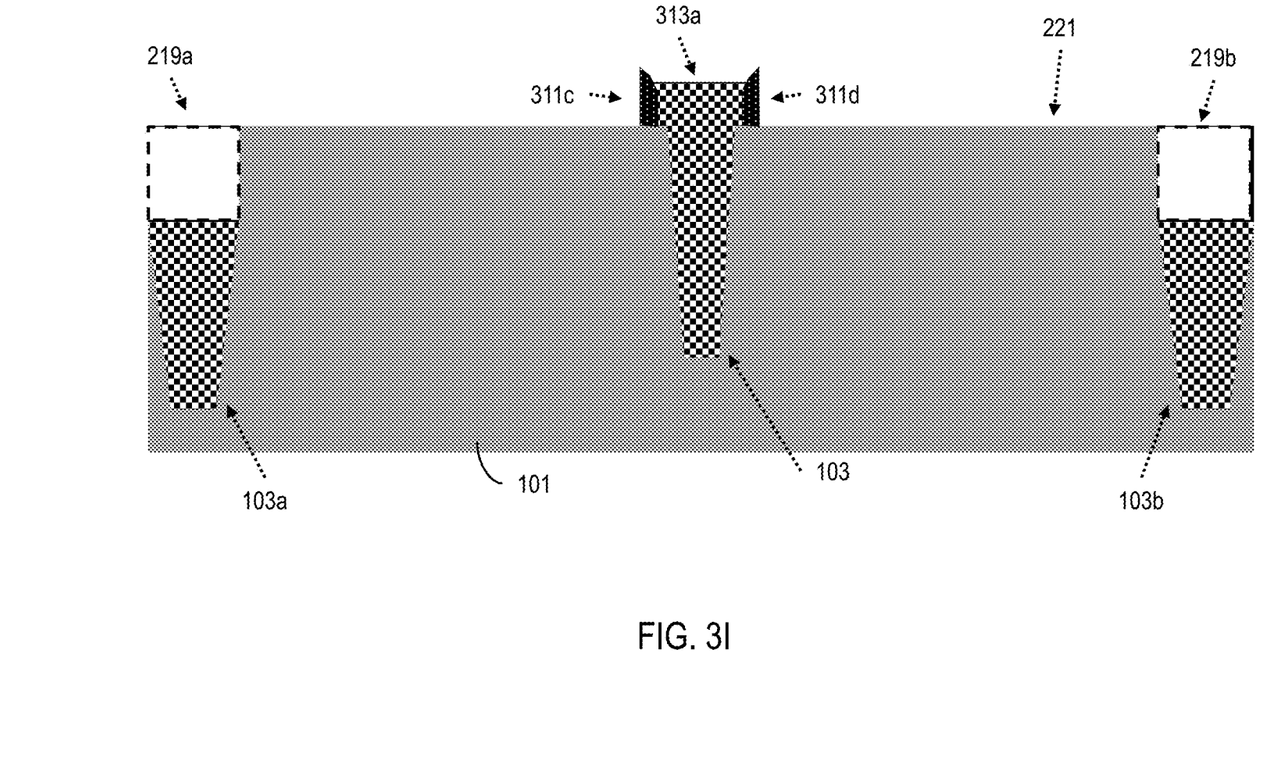

Referring now to FIG. 3F, an oxide layer 217 is deposited on the upper surface of the hard mask 201, filling the opening 205, e.g. by HDP. In FIG. 3G, CMP is performed down to the upper surface of hard mask 201. As shown in FIG. 3H, the hard mask 201 is removed, for example by etching or stripping, to expose an oxide block 313 that includes the spacers 311c and 311d as well as the oxide sidewalls 303a and 303b. Next, as shown in FIG. 3I, when sections 219a and 219b, respectively, of the STI regions 103a and 103b are removed to reveal substrate fin 221 on the upper portion of the substrate 101, a portion of the oxide block 313 is also removed, leaving oxide material 313a on the upper surface region 211 of the STI 103 between the spacers 311c and 311d. Also, the oxide sidewalls 303a and 303b are removed to expose outer sides of the spacers 311c and 311d. The process then continues as in FIGS. 2J through 2L.

It is noted that other typical IC fabrication processes may be utilized along with the processes discussed above.

The embodiments of the present disclosure can achieve several technical effects, including creation of uniform cavities or shapes in a substrate of an IC device as well as having the cavities or shapes filled with respective materials to a uniform level. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 7 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a hard mask on an upper surface of a silicon (Si) substrate, the hard mask having an opening over a shallow trench isolation (STI) region formed in the Si substrate and extending over adjacent portions of the Si substrate, wherein the opening and the STI region each have a width and the width of the opening is greater than the width of the STI region;
   forming low-k dielectric spacers on a lower portion of sidewalls of the opening, the spacers being formed between the sidewalls and the STI region;
   filling the opening with an oxide;
   removing the hard mask;
   removing an upper portion of the oxide and a portion of the low-k dielectric spacers;
   revealing a Si fin in the Si substrate;
   forming equally spaced gate electrodes, each having sidewall spacers, over the Si fin and the oxide; and
   forming source/drain regions in the Si fin between each pair of adjacent gate electrodes.

2. The method of claim 1, wherein the forming of the low-k dielectric spacers comprises:
   conformally forming a low-k dielectric layer on an upper surface of the hard mask and in the opening; and
   removing the low-k dielectric layer from the upper surface of the hard mask, an upper surface of the STI region, and a portion of each sidewall.

3. The method of claim 1, wherein the filling of the opening with an oxide comprises:
   forming an oxide layer over the upper surface of the hard mask; and
   removing the oxide layer from the upper surface of the hard mask.

4. The method of claim 1, wherein additional STI regions are formed in the Si substrate at opposite sides of and separated from the STI region, the method further comprising:

revealing the Si fin by removing an upper portion of each of the additional STI regions.

5. The method of claim 1, wherein the forming of the source/drain regions comprises:

forming a cavity in the Si fin between each pair of the adjacent gate electrodes; and epitaxially growing source/drain materials in the cavity.

6. The method of claim 5, wherein upper surfaces of the materials in the source/drain regions at opposite sides of a gate electrode over the oxide are coplanar with upper surfaces of the materials in other source/drain regions.

7. The method of claim 6, wherein depths of the source/drain regions at the opposite sides of the gate electrode over the oxide are same as depths of the other source/drain regions.

8. A method comprising:

forming a hard mask on an upper surface of a silicon (Si) substrate, the hard mask having an opening over a shallow trench isolation (STI) region formed in the Si substrate and extending over adjacent portions of the Si substrate, wherein the opening and the STI region each have a width and the width of the opening is greater than the width of the STI region;

forming an oxide layer on sidewalls of the opening;

forming low-k dielectric spacers on a lower portion of the oxide layer, the spacers being formed between the oxide layer and the STI region;

filling the opening with an oxide;

removing the hard mask;

removing an upper portion of the oxide and the oxide layer;

revealing a Si fin in the Si substrate;

forming equally spaced gate electrodes, each having sidewall spacers, over the Si fin and the oxide; and forming source/drain regions in the Si fin between each pair of adjacent gate electrodes.

9. The method of claim 8, wherein the forming of the low-k dielectric spacers comprises:

conformally forming a low-k dielectric layer on an upper surface of the hard mask and in the opening; and removing the low-k dielectric layer from the upper surface of the hard mask, an upper surface of the STI region and a portion of the oxide layer.

10. The method of claim 8, wherein the filling of the opening with an oxide comprises:

forming an oxide layer over the upper surface of the hard mask; and removing the oxide layer from the upper surface of the hard mask.

11. The method of claim 8, wherein additional STI regions are formed in the Si substrate at opposite sides of and separated from the STI region, the method further comprising:

revealing the Si fin by removing an upper portion of each of the additional STI regions.

12. The method of claim 8, wherein the forming of the source/drain regions comprises:

forming a cavity in the Si fin between each pair of the adjacent gate electrodes; and epitaxially growing source/drain materials in the cavity.

13. The method of claim 12, wherein upper surfaces of the materials in the source/drain regions at opposite sides of the gate electrode over the oxide are coplanar with upper surfaces of the materials in other source/drain regions.

14. The method of claim 13, wherein depths of the source/drain regions at opposite sides of the gate electrode over the oxide are same as depths of the other source/drain regions.

* * * * *